(12) United States Patent
Yadav

(10) Patent No.: US 8,407,569 B1
(45) Date of Patent: Mar. 26, 2013

(54) ERROR EVENT PROCESSING METHODS AND SYSTEMS

(75) Inventor: Manoj Kumar Yadav, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/481,979

(22) Filed: May 29, 2012

Related U.S. Application Data

(63) Continuation of application No. 12/572,503, filed on Oct. 2, 2009, now Pat. No. 8,205,144.

(60) Provisional application No. 61/104,892, filed on Oct. 13, 2008.

(51) Int. Cl.
*H03M 13/00* (2006.01)

(52) U.S. Cl. .................................. 714/785; 714/794

(58) Field of Classification Search .............. 714/746, 714/758, 763, 776, 777, 785, 793–795
See application file for complete search history.

(56) References Cited

U.S. PATENT DOCUMENTS

| | | | |
|---|---|---|---|
| 6,823,487 B1 | 11/2004 | Poeppelman | |
| 7,571,372 B1 * | 8/2009 | Burd et al. | 714/769 |
| 7,793,197 B2 | 9/2010 | Ito et al. | |
| 7,805,664 B1 * | 9/2010 | Yang et al. | 714/794 |
| 7,949,927 B2 * | 5/2011 | Park et al. | 714/762 |
| 8,040,953 B2 | 10/2011 | Yang et al. | |
| 8,108,759 B2 * | 1/2012 | Moon et al. | 714/781 |
| 2008/0008272 A1 | 1/2008 | Yang et al. | |

OTHER PUBLICATIONS

Duggan, Andrew; Barg, Alexander; , "Error Bounds for Algebraic Soft-Decision Decoding of Reed-Solomon Codes over Additive-Noise Channels," Information Theory, 2007. ISIT 2007. IEEE International Symposium on , vol., no., pp. 2816-2820, Jun. 24-29, 2007.*

Chunlong Bai; Bartosz Mielczarek; Witold A. Krzymien; Ivan J. Fair; ,"Improved Analysis of List Decoding and Its Application to Convolutional Codes and Turbo Codes," Information Theory, IEEE Transactions on , vol. 53, No. 2, pp. 615-627, Feb. 2007.*

Jingfeng Liu; Hongwei Song; Kumar, B.V.K.V.; , "Symbol timing recovery for low-SNR partial response recording channels," Global Telecommunications Conference, 2002. GLOBECOM '02. IEEE , vol. 2, no., pp. 1129-1136 vol. 2, Nov. 17-21, 2002.*

Wang et al., CRC-assisted error connection in a convolutionally coded system, Communications, IEEE Transactions on 56(11):1807-1815 (2008).

Adjudeanu et al., On the correlation between error weights and syndrome weights for belief propagation decoding of LDPC codes, Information Theory, CWIT 2009, $11^{th}$ Canadian Workshop on, pp. 36-41 (May 13-15, 2009).

* cited by examiner

*Primary Examiner* — Cynthia Britt

(57) ABSTRACT

Circuitry and methods can be provided to correct errors in decision bits. A plurality of error event syndromes can be computed for a first plurality of error events. For each of a plurality of error event syndromes, two best error events can be selected. A cross-syndrome second best error event can be selected from among the first plurality of error events. A global second best error event can be selected from among the cross-syndrome second best error event and the second best per-syndrome error events. A second plurality of error events can be selected from among the global second best error event and the best per-syndrome error events. The second plurality of error events can be used for data post-processing.

15 Claims, 11 Drawing Sheets

$$508$$

$$\begin{matrix} 502 \\ 504 \\ 506 \end{matrix} \begin{bmatrix} 1 & 0 & 0 & 0 & 1 & 0 & 0 & 0 & 1 & 0 & 0 & 0 \\ 0 & 1 & 0 & 1 & 0 & 1 & 0 & 1 & 0 & 1 & 0 & 1 \\ 0 & 0 & 1 & 0 & 0 & 0 & 1 & 0 & 0 & 0 & 1 & 0 \end{bmatrix}$$

$$x_0 \ x_1 \ x_2 \ x_3 \ x_4 \ x_5 \ x_6 \ x_7 \ x_8 \ x_9 \ x_{10} \ x_{11}$$

$$S_0 = x_0 \oplus x_4 \oplus x_8$$

$$S_1 = x_1 \oplus x_3 \oplus x_5 \oplus x_7 \oplus x_9 \oplus x_{11}$$

$$S_2 = x_2 \oplus x_6 \oplus x_{10}$$

FIG. 5

Let s = Decision Bit Syndrome
M (N) = Metric of Most Likely Error Event with Syndrome N
    M (0) = 0

Then LLR (x) = M(s ⊕ x) - M (s)

Where x ∈ {1, ..., 7}
    M ∈ {0, ..., 31}
    LLR ∈ {-31, ..., 31}

If don't observe any error events with
a syndrome s, then set M (s) = 31

FIG. 8

ERROR EVENT PROCESSING METHODS AND SYSTEMS

CROSS-REFERENCE TO RELATED APPLICATIONS

This application is a continuation of, and claims the benefit of and priority to, U.S. patent application Ser. No. 12/572,503, filed Oct. 2, 2009 (currently pending), which claims the benefit of and priority to U.S. Provisional Application No. 61/104,892, filed Oct. 13, 2008. Each of U.S. patent application Ser. No. 12/572,503 and U.S. Provisional Application No. 61/104,892 is incorporated herein by reference in its respective entirety.

BACKGROUND

This disclosure relates to identifying and counting errors in a communication signal. More particularly, this disclosure relates to processing error events, including error event masks and error event likelihood metrics, in connection with low-density parity check (LDPC) decoding.

Consider a system that can be represented by a finite state machine. For example, a finite state machine can be used to model an inter-symbol-interference (ISI) channel or a convolutional code encoder. A trellis diagram can be used to represent the sequence of all possible paths (i.e., sequences of states) that the system can visit over time. If the system can transition from state A at time t to state B at time t+1, then these states are connected by a branch. Each branch may be labeled by X/Y pair, where X denotes the input that causes the system to transition from state A to B and Y represents an output corresponding to this transition. For example, an ISI channel with a two-bit channel response can be represented by a four-state trellis diagram. The states of this trellis can be labeled as 00, 01, 10, 11 and may be associated with the latest two bits transmitted through the ISI channel. For example, if the system is at state 01 at time t, and 0 is transmitted, then the next state at time t+1 would be 10. Similarly, the system would transition to state 11 if 1 were transmitted. Channel output Y that results from these transitions is a real number m, that may be different for each branch.

In the ISI channel situation, the signals at the output of the ISI channel are detected by a trellis-based detector, such as a Viterbi (maximum-likelihood) detector. In the convolutional encoder situation, where an encoder receives input bits and generates output bits that are weighted sums of the input bits, the bits at the output of the encoder (also called "parity bits") are communicated to a receiver and are decoded using a Viterbi decoder. In either situation, the detector/decoder is based on the trellis representing the ISI channel or the convolutional code encoder. However, a Viterbi detector/decoder does not know the particular path that occurred in the trellis of the ISI channel/convolutional code encoder. Rather, the Viterbi detector/decoder must use the signals/bits it receives and find the trellis path that most-likely occurred based on the received signals/bits.

This detection/decoding is often complicated by the presence of noise or errors in the received signals/bits. In some situations, the trellis path that most likely occurred based on the received signals/bits may not be the same as the trellis path that actually occurred in the ISI channel/convolutional code encoder. In such situations, another layer of error correction may be applied before the ISI channel/convolutional encoding, so that any errors that may remain after Viterbi detection/decoding can be addressed. In this case, it may be helpful to determine the potential location and nature of these errors and to provide this information to an additional layer of error correction applied after the detection/decoding. This additional layer of error correction may then process that error information in order to determine and apply the most suitable error correction to the output signals/bits generated by the Viterbi detector/decoder and ensure a more accurate decoded data output.

SUMMARY

In accordance with certain embodiments, errors can be corrected in decision bits as follows. A first plurality of error events can be received, where each error event has an error mask and an error event metric. A plurality of error event syndromes can be computed based on the first plurality of error events. For each of a plurality of possible error event syndromes, two error events can be selected, from among the first plurality of error events, whose computed error event syndromes correspond to the possible error event syndrome. Each of the two error events can have an error event metric lower than or equal to error event metrics for all other error events corresponding to the possible error event syndrome, and the two error events can include a best per-syndrome error event and a second best per-syndrome error event.

A cross-syndrome second best error event can be selected from among the first plurality of error events, where an error event metric of the cross-syndrome second best error event is the lowest error event metric from among the error event metrics of the first plurality of error events that is also lower than or equal to an error event metric for another error event corresponding to a same error event syndrome. A global second best error event can be selected, from a first set including the cross-syndrome second best error event and the second best per-syndrome error events, whose error event metric is lower than or equal to error metrics for all but one of the other error events in the first set. Finally, a second plurality of error events can be selected from a second set including the global second best error event and the best per-syndrome error events, where each of the second plurality of error events has an error event metric less than or equal to error event metrics of all other error events in the second set.

In some embodiments, a plurality of decision bits can be received, a plurality of decision bit syndromes can be computed computing based on the decision bits, and a plurality of log-likelihood ratios can be computed for each of a plurality of possible decision bit syndromes based on the best per-syndrome error events and the computed plurality of decision bit syndromes. Low-density parity check (LDPC) decoding can be performed based on the computed log-likelihood ratios. Additionally, post-processing can be performed based on the plurality of decision bits, the second plurality of error events, and an output of the LDPC decoding to generate decoded information with at least one correction.

In some embodiments, LDPC decoding can be performed based on the second plurality of error events.

In some embodiments, the first plurality of error events can be sorted by error event metric to generate a first sorted set, where the best per-syndrome error events and the second best per-syndrome error events are selected based on the first sorted set.

In accordance with certain embodiments, a circuit can be provided for correcting errors in decision bits. The circuit can include error event syndrome computation circuitry operable to receive a first plurality of error events, where each error event of the first plurality includes an error event mask and an error event metric, and compute a plurality of error event syndromes based on the received first plurality of error events. The circuit can also include error event syndrome computation circuitry operable to receive a first plurality of error events, where each error event of the first plurality includes an error event mask and an error event metric, and compute a plurality of error event syndromes based on the received first plurality of error events. The circuit can also include per-syndrome selection circuitry coupled to the error event syndrome computation circuitry and operable to select, for each of a plurality of possible error event syndromes, two error events, from among the received plurality of error events, whose computed error event syndromes correspond to the possible error event syndrome. Each of the two error events can have an error event metric lower than or equal to error event metrics for all other error events corresponding to the possible error event syndrome, and the two error events can include a best per-syndrome error event and a second best per-syndrome error event.

The circuit can also include cross-syndrome second best selection circuitry coupled to the error event syndrome computation circuitry and operable to select, from among the received plurality of error events, a cross-syndrome second best error event. An error event metric of the cross-syndrome second best error event can be the lowest error event metric from among the error event metrics of the received first plurality of error events that is also lower than or equal to an error event metric for another error event corresponding to a same error event syndrome. Additionally, the circuit can include global second best selection circuitry coupled to the per-syndrome selection circuitry and the cross-syndrome second best selection circuitry. The global second best selection circuitry can be operable to select, from a first set comprising the cross-syndrome second best error event and the second best per-syndrome error events, a global second best error event whose error metric is lower than or equal to error metrics for all but one of the other error events in the first set. Finally, the circuit can include output selection circuitry coupled to the per-syndrome selection circuitry and the global second best selection circuitry. The output selection circuitry can be operable to select, from a second set comprising the global second best error event and the best per-syndrome error events, a second plurality of error events, where each of the second plurality of error events has an error event metric less than or equal to error event metrics of all other error events in the second set.

In some embodiments, the circuit can also include decision bit syndrome computation circuitry operable to receive a plurality of decision bits and compute a plurality of decision bit syndromes based on the decision bits. The circuit can additionally include log-likelihood ratio computation circuitry coupled to the decision bit syndrome computation circuitry and the per-syndrome selection circuitry. The log-likelihood ratio computation circuitry can be operable to compute a plurality of log-likelihood ratios for each of a plurality of possible decision bit syndromes based on the best per-syndrome error events and the computed plurality of decision bit syndromes. In some embodiments, the circuit can further include LDPC decoding circuitry coupled to the log-likelihood ratio computation circuitry and operable to perform LDPC decoding based on the computed log-likelihood ratios. In some embodiments, the circuit can further include post-processing circuitry coupled to the output selection circuitry and the LDPC decoding circuitry and operable to perform post-processing based on the received plurality of decision bits, the second plurality of error events, and an output of the LDPC decoding to generate decoded information with at least one correction.

In some embodiments, the circuit can further include LDPC decoding circuitry coupled to the output selection circuitry and operable to perform decoding based on the second plurality of error events.

In some embodiments, the circuit can further include sorting circuitry coupled between the error event syndrome computation circuitry and the per-syndrome selection circuitry. The sorting circuitry can be operable to sort the received first plurality of error events by error event metric to generate a first sorted set, where the per-syndrome selection circuitry is further operable to select the best per-syndrome error events and the second best per-syndrome error events based on the first sorted set.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 5 is a diagram showing illustrative decision bit syndrome computation in accordance with some embodiments;

FIG. 8 is a diagram showing illustrative log-likelihood ratio computation in accordance with some embodiments;

DETAILED DESCRIPTION

The disclosed technology provides systems and methods for processing potential error events, including error event masks and error event metrics, in connection with trellis-based detection/decoding. As used herein, the term "information" will refer to binary digits that may be physically embodied in many ways that are known in the art. As used herein, in the case of convolutional encoding, information to be encoded will be referred to as "user information," and information produced by an encoder based on user information will be referred to as "parity information." User information may include information that has already been encoded by some type of encoder.

Figure 1A:
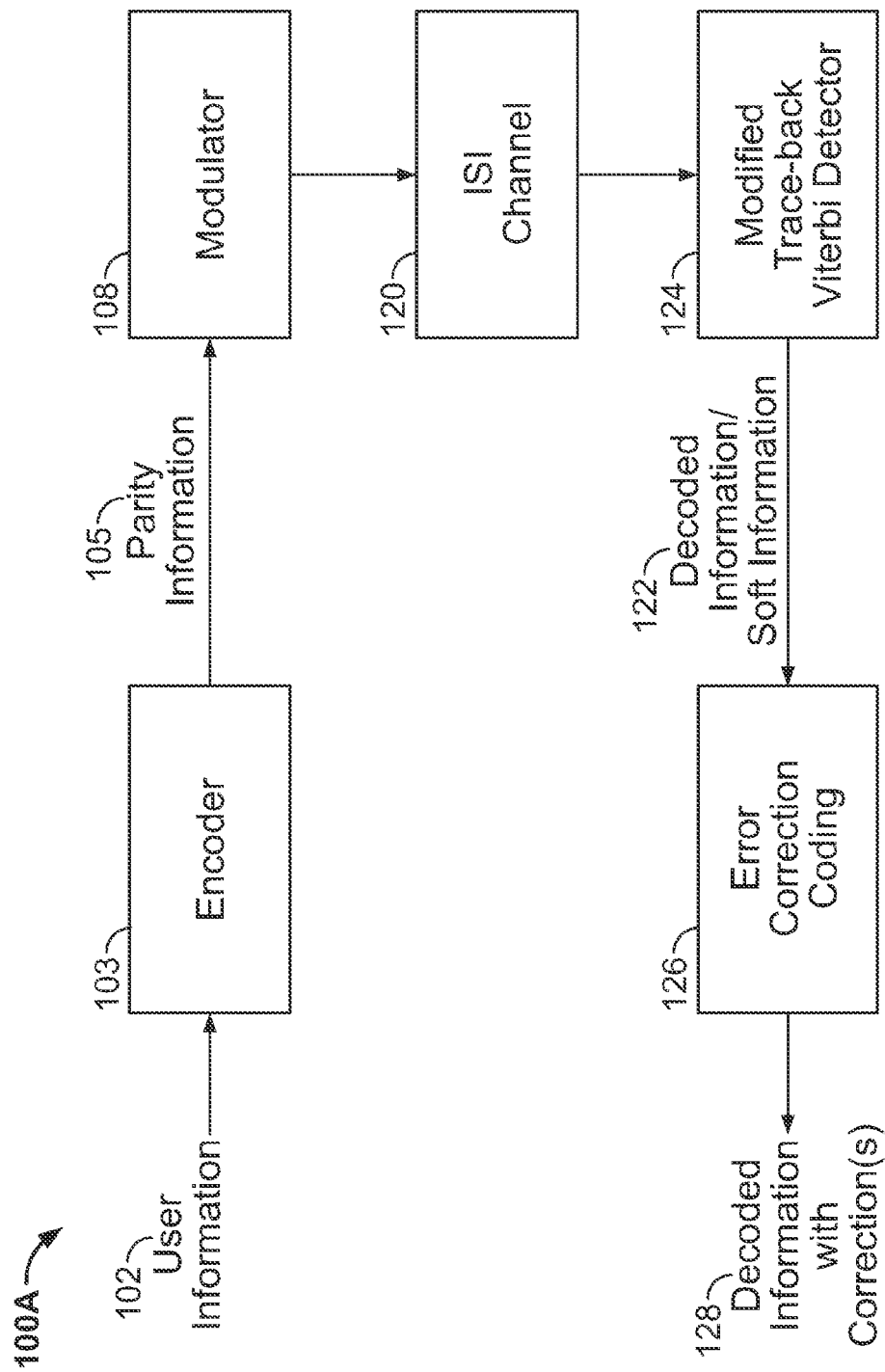
FIG. 1A is a block diagram of an illustrative system that includes an ISI channel and error correction coding circuitry in accordance with some embodiments.

Referring to FIG. 1A, there is shown an exemplary communication/storage system 100A that includes an inter-symbol interference (ISI) channel 120. The system includes user information 102 that is intended for communication/storage.

User information 102 that is intended for communication/ storage can be encoded by an encoder 103 to generate parity information 105. The encoder 103 introduces additional information such that parity information 105 includes more bits than user information 102. In some embodiments, a portion of the parity information 105 may include the user information 102, in which case, the encoder is known as a "systematic" encoder. From this point on, for ease of explanation, it will be assumed that in this embodiment encoder 103 is not a systematic encoder. Therefore, the entire output of the trellis-based encoder 103 will be referred to as parity information 105 or parity bits. However, it is contemplated that the disclosed invention applies to systematic encoders as well.

The parity bits 105 can be modulated by a modulator 108, which can perform electric-, magnetic-, or optical-based modulation, or another type of modulation. The modulator 108 transforms the user information into signals (not shown), which are received by the ISI channel 120. The signals at the output of the ISI channel 120 may be weighted sums of the signals received by the ISI channel 120. The modified trace-back Viterbi detector 124 receives the signals at the output of the ISI channel 120 and produces decoded information and/or soft information 122 based on the ISI channel's output signals (not shown). If there are no errors in the decoded information 122, the decoded information 122 will be the same as the user information 102. Otherwise, the decoded information 122 will be different from the user information 102.

In order to account for the possibility that the decoded information 122 may contain errors causing it to differ from user information 102, decoded information 122 is further processed by error correction coding circuitry 126. Error correction coding circuitry 126 receives potential error events from the modified trace-back Viterbi detector 124, determines which errors are most likely present in the decoded information 122, and corrects those errors to generate decoded information with correction(s) 128.

Figure 1B:
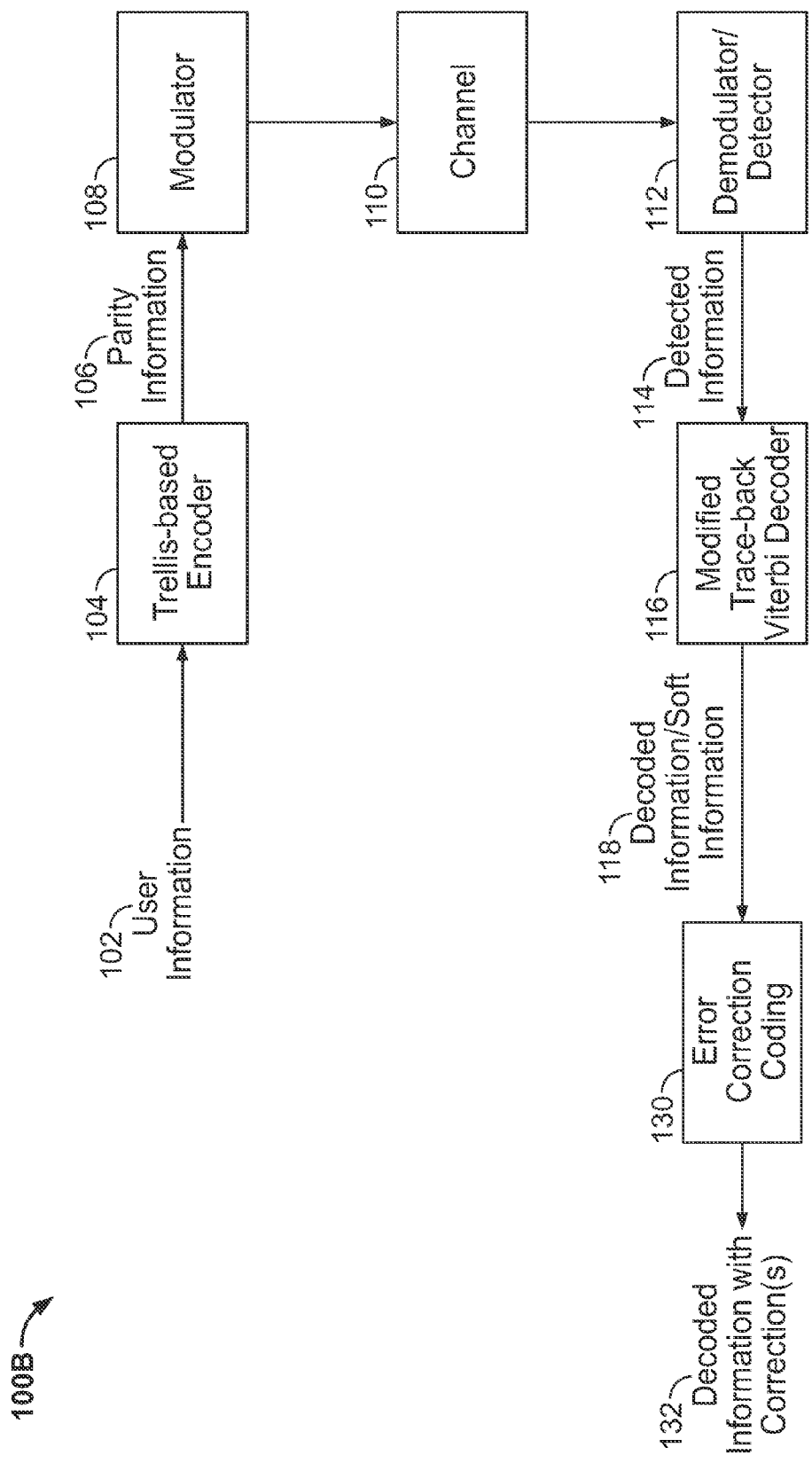
FIG. 1B is a block diagram of an illustrative system that uses a trellis-based code and error correction coding circuitry in accordance with some embodiments.

Referring now to FIG. 1B, there is shown an exemplary communication/storage system 100B that employs a trellis-based code. User information 102 that is intended for communication/storage can be encoded by a trellis-based encoder 104 to generate parity information 106. The trellis-based encoder 104 introduces additional information such that parity information 106 includes more bits than user information 102. In some embodiments, a portion of the parity information 106 may include the user information 102, in which case, the encoder is known as a "systematic" encoder. From this point on, for ease of explanation, it will be assumed that in this embodiment the trellis-based encoder 106 is not a systematic encoder. Therefore, the entire output of the trellis-based encoder 104 will be referred to as parity information 106 or parity bits. However, it is contemplated that the disclosed invention applies to systematic encoders as well.

In the system of FIG. 1B, a modulator 108 configures the parity information 106 into a signal (not shown), which is passed to the channel 110. As used herein, the term "channel" refers to the media, devices, and/or processing stages that occur between a modulator 108 and a detector/demodulator 112 and can correspond to a particular path of media/devices through which a signal can flow, a particular wavelength or time slot which a signal can utilize, and/or another multiple access scheme. For example, in FIG. 1B, the channel 110 can correspond to storage and write and read components of a disk drive, including a magnetic storage medium, a disk-drive read/write head, and other storage system components. In some cases, the term "channel" as used herein can also include the modulator 108 and the demodulator/detector 112. While in the channel 110, the signal may encounter error-producing phenomena, such as device physical failure, device electrical failure, signal interference, and/or data loss due to buffer overflow, for example. The interference signals and other error-producing phenomena in a channel 110 will be referred to herein as "noise." As shown by the description above, the terms channel and noise are more conceptual than physical, but they may also correspond to physical aspects of a system. For ease of explanation, it will be assumed that, in this embodiment, the channel 110 of FIG. 1B is not an ISI channel. However, it is contemplated that the channel 110 can include an ISI channel.

With continuing reference to FIG. 1B, the signal on the channel 110 can be received by a demodulator/detector 112. The demodulator/detector 112 can produce detected information 114 based on the received signal. If there are no errors in the detected information 114, the detected information should be the same as the parity information 106. If there are errors, however, the modified trace-back Viterbi decoder 116 may be able to correct some or all of the errors by virtue of the maximum-likelihood detection. If the modified trace-back Viterbi decoder 116 is able to correct all of the errors, the decoded information 118 will be the same as the user information 102. Otherwise, the decoded information 118 will be different from the user information 102.

In order to account for the possibility that the decoded information 118 may contain errors causing it to differ from user information 102, decoded information 118 is further processed by error correction coding circuitry 130. Error correction coding circuitry 130 receives potential error events from the modified trace-back Viterbi decoder 116, determines which errors are most likely present in the decoded information 118, and corrects those errors to generate decoded information with correction(s) 132.

Those skilled in the art will recognize that various modulation/demodulation technologies can be used. Those skilled in the art will also recognize that, in one embodiment, the trellis-based encoder 104 and the modulator 108 can be combined in a technology known as "trellis-coded modulation."

Figure 2:
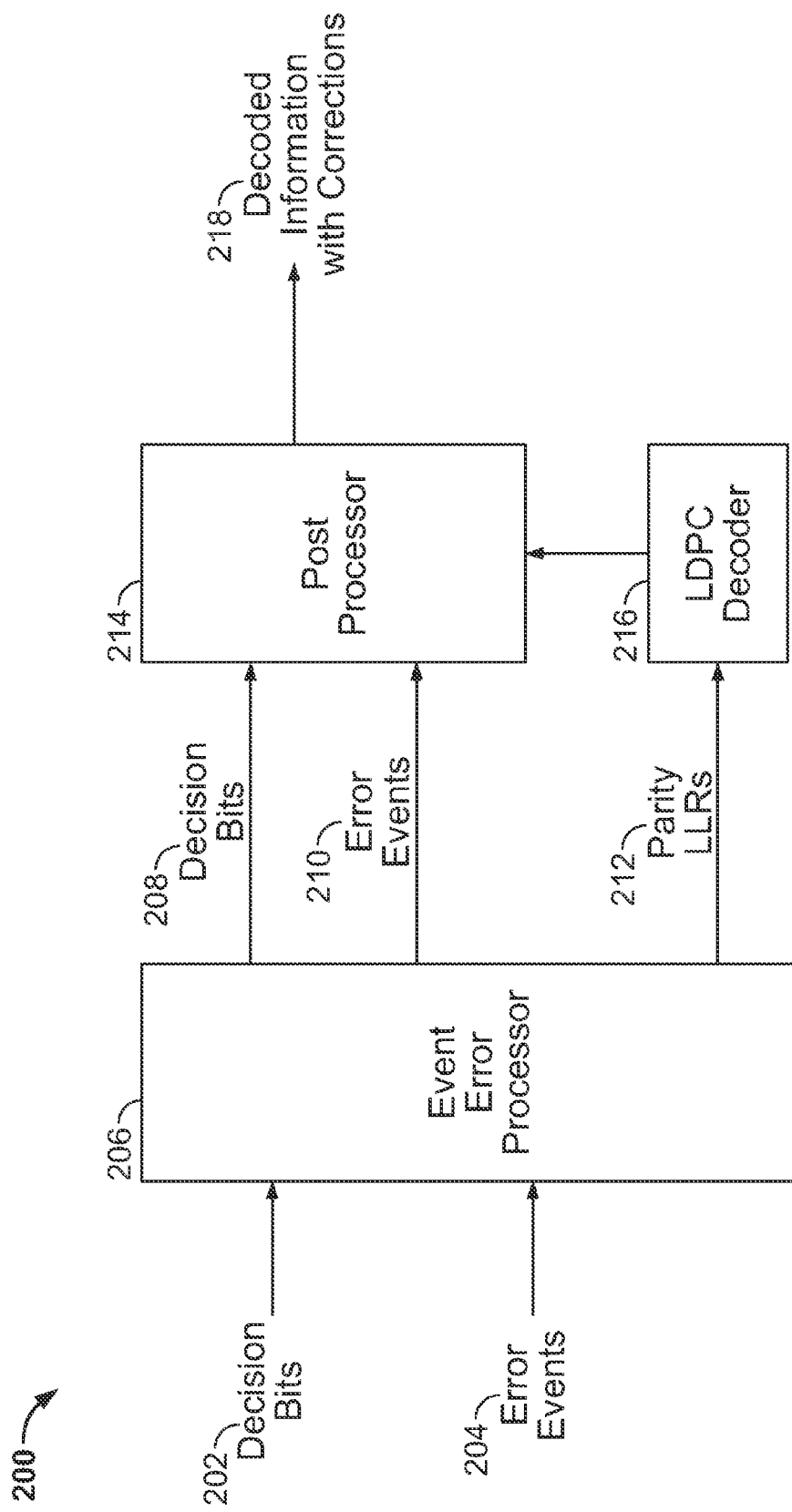
FIG. 2 is a block diagram of illustrative error correction coding circuitry in accordance with some embodiments.

FIG. 2 is a block diagram of illustrative error correction coding circuitry 200 in accordance with some embodiments. Error correction coding circuitry 200 can be used as either or both of error correction coding circuitries 126 and 130 in FIGS. 1A and 1B, respectively, and can include error event processor 206, post processor 214, and LDPC decoder 216. Error correction coding circuitry 200 receives decision bits 202 and error events 204 from suitable detector/decoder circuitry, such as modified trace-back Viterbi detector 124 of FIG. 1A or modified trace-back Viterbi decoder 116 of FIG. 1B. Exemplary embodiments of trace-back Viterbi detectors/decoders are described in greater detail in co-pending, commonly assigned U.S. patent application Ser. No. 12/572,329, entitled "MODIFIED TRACE-BACK USING SOFT OUTPUT VITERBI ALGORITHM (SOYA)", filed concurrently herewith, which is hereby incorporated by reference herein in its entirety.

Decision bits 202 can represent decoded information corresponding to a best path generated by the modified Viterbi trace-back detector/decoder. Decision bits 202 can be equal to originally transmitted user information 102 if not corrupted by channel noise during transmission or if any errors resulting from such noise have already been corrected by a detector/decoder before being transmitted to error event processor 206.

Error events 204 can include error event masks and error event metrics. Error event masks are binary strings that may be combined with a decision-bit string of the same length via an exclusive-or (XOR) operation in order to correct a particular set of errors defined by each mask. Thus, the binary "1's" in each error event mask represent the bit locations of candidate errors in the decision-bit string. Error event metrics are values indicating the likelihood that the corresponding error event mask represents a set of errors that requires correction in the decision-bit string. For purposes of discussion herein, it will be assumed that lower error event metrics generally correspond to higher likelihoods, although the reverse convention may also be used.

Error event processor 206 receives decision bits 202 and error events 204, and identifies an appropriate subset of error events 204 for transmission to post processor 214 as error events 210. Error event processor 206 also forwards decision bits 202, or portions thereof, to post processor 214 as decision bits 208, and computes parity log-likelihood ratios (LLRs) 212 for transmission to LDPC decoder 216.

In some embodiments, decision bits 208, error events 210, and parity LLRs 212 are stored in memory circuitry for later retrieval by post processor 214 and LDPC decoder 216 at appropriate times. When enough parity LLRs 212 have been stored in such memory circuitry, LDPC decoder 216 uses them to perform decoding for a selected code, such as a tribit code, a dibit code, or a single-bit code. The results of such decoding are then forwarded to post processor 214, which uses these results, along with decision bits 208 and error events 210, to decide which errors should be corrected in decision bits 208. After the selected error correction is performed by post processor 214, decoded information with corrections 218 is output for use by suitable processing or receiving circuitry. Further details on post-processing techniques and circuitry are provided in co-pending, commonly assigned U.S. patent application Ser. No. 11/840,109, entitled "SOFT-OUTPUT DETECTION POST-PROCESSING SYSTEMS AND METHODS," filed Aug. 16, 2007, which is hereby incorporated by reference herein in its entirety.

Figure 3:
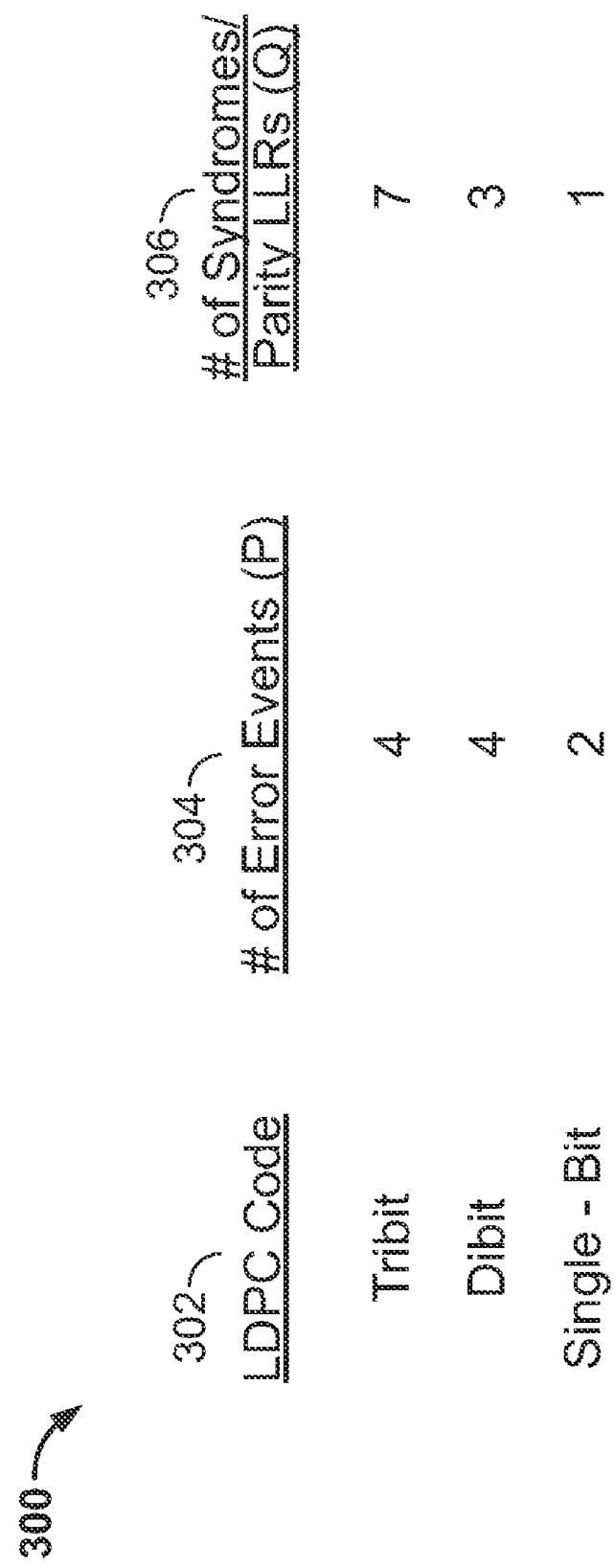
FIG. 3 is a table showing illustrative LDPC codes and corresponding properties that can be used by error correction coding circuitry in accordance with some embodiments.

FIG. 3 is a table showing illustrative LDPC codes and corresponding properties that can be used by error correction coding circuitry 200 in accordance with some embodiments. Column 302 lists three illustrative LDPC codes: tribit, dibit, and single-bit. Tribit codes use three parity bits per symbol that together can take eight possible values, dibit codes use two parity bits per symbol that together can take four possible values, and single-bit codes use only one parity bit per symbol with two possible values. Each symbol can contain any suitable number of bits (e.g., 10, 12, or any other appropriate number).

Column 304 shows the number of error events (denoted "P" for future reference) used by each of the illustrative codes listed in column 302. As can be seen, tribit and dibit codes can use four error events, while single-bit codes can use two error events. The number of error events used with a particular code can be determined in any suitable way, such as to fulfill requirements of post processor 214, to optimize speed or accuracy of error correction (e.g., as determined by simulations), or in any other appropriate manner.

Column 306 shows the number of syndromes used by each of the illustrative codes in column 302, which can be equal to the number of parity LLRs (denoted "Q" for future reference). In illustrative table 300, the number of syndromes/parity LLRs for a particular LDPC code can be equal to one less than the number of possible values for the binary parity bit sequence corresponding to that code. For example, as noted above, a tribit LDPC code utilizes a three-bit sequence with eight possible values, and the number of syndromes/parity LLRs can be one less than that, or seven. Similarly, dibit codes can use three syndromes/parity LLRs and single-bit codes can use one syndrome/parity LLR. This relationship can be the result of an implementation in which, for example, the zero value of the parity bit sequence is never used and can therefore be ingored. It will be noted that this implementation may be varied and other parameters may be used with certain embodiments.

More generally, it will be noted that while this disclosure focuses on the use of LDPC codes for purposes of clarity, embodiments may be applied to other types of codes as well. Additionally, LDPC codes other than those listed in FIG. 3 can be used, and the codes listed can be used with other numbers of error events, other numbers of syndromes/parity LLRs, or both.

Figure 4:
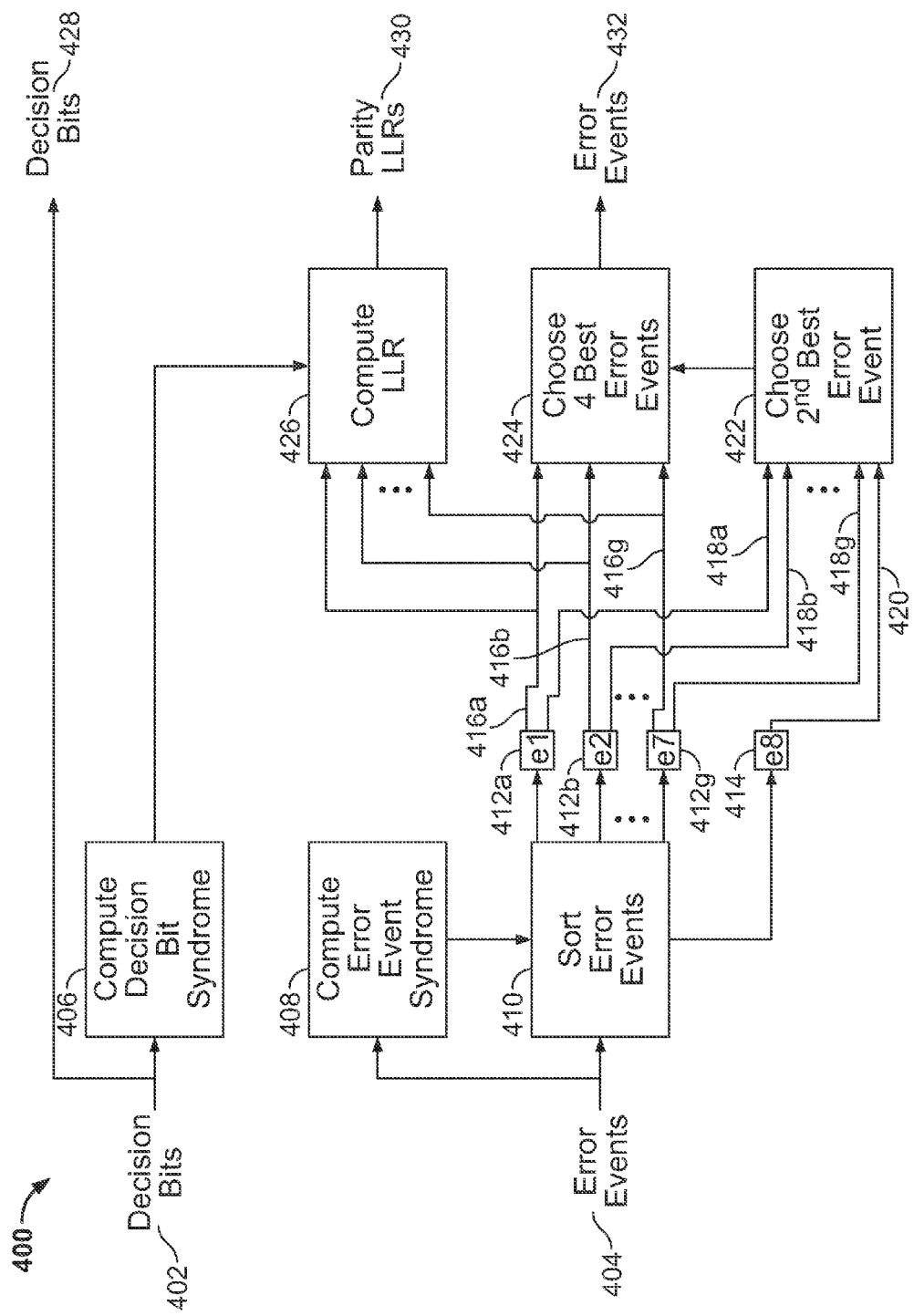
FIG. 4 is a block diagram of illustrative error event processing circuitry in accordance with some embodiments.

FIG. 4 is a block diagram of illustrative error event processing circuitry 400 in accordance with some embodiments. Error event processing circuitry 400, which can be included in error event processor 206 of FIG. 2, can include decision bit syndrome computation circuitry 406, error event syndrome computation circuitry 408, error event sorting circuitry 410, per-syndrome selection circuitry 412a-412g, cross-syndrome second best selection circuitry 414, global second best selection circuitry 422, output selection circuitry 424, and LLR computation circuitry 426. Advantageously, as will be explained in greater detail below, error event processing circuitry 400 can support multiple LDPC codes with the same circuitry. However, for purposes of discussion, it will initially be assumed that it is to be used with a tribit LDPC code.

Decision bits 402 are forwarded to output decision bits signal 428 and also received by decision bit syndrome computation circuitry 406, which computes syndromes corresponding to decision bits 402. For a tribit LDPC code, seven decision bit syndrome values may be possible, as indicated by FIG. 3. The computation of decision bit syndromes will be described in greater detail in connection with FIG. 5. The computed decision bit syndromes are forwarded to LLR computation circuitry 426.

Error events 404 are received by error event syndrome computation circuitry 408, which computes corresponding error event syndromes, as described in greater detail in connection with FIG. 6. Again, if a tribit LDPC code is used, there may be seven possible error event syndromes. The computed syndromes are sent to error event sorting circuitry 410, which also receives error events 404.

Error event sorting circuitry 410 sorts incoming error events 404 according to their error event metrics. In some embodiments, lower metrics correspond to higher likelihoods and are thus preferred. Any suitable sorting circuitry can be used in error event sorting circuitry 410, including pipelined implementations. Because suitable sorting algorithms and circuitry will be apparent to those of skill in the art in view of the present disclosure, possible implementations of error event sorting circuitry 410 will not be described in detail herein.

The sorted error events generated by error event sorting circuitry 410 can be sent to per-syndrome selection circuitry 412a-412g, labeled e1-e7 in FIG. 4. Each of per-syndrome selection circuits 412a-412g identifies the best (e.g., lowest metric) error event having a particular syndrome corresponding to that per-syndrome selection circuit per clock cycle, then keeps the two best (e.g., lowest-metric) error events from among those corresponding to that syndrome for a symbol. The best per-syndrome error events selected by per-syndrome selection circuitry 412a-412g are output at respective outputs 416a-416g, while the second best per-syndrome error events are output at respective outputs 418a-418g. Per-syndrome selection circuitry 412a-412g is described in greater detail in FIG. 7.

In this illustrative example, seven per-syndrome selection circuits are used because tribit LDPC codes can have up to seven possible syndrome values. Advantageously, error event processing circuitry 400 can also support dibit LDPC codes and single-bit LDPC codes. For example, for a dibit LDPC code only three of per-syndrome selection circuits 412a-412g need be used. Similarly, for a single-bit LDPC code only one of per-syndrome selection circuits 412a-412g need be used. Thus, the architecture depicted in FIG. 4 permits a single circuit to be used with any of several types of LDPC codes, including multi-bit codes.

The sorted error events generated by error event sorting circuitry 410 can also be sent to cross-syndrome secnod best selection circuitry 414, Cross-syndrome second best selection circuitry 414 does not correspond to any particular syndrome, but instead identifies a cross-syndrome second best error event across all error events output by error event sorting circuitry 410 each clock cycle. Recall that the two best error events per clock cycle corresponding to a particular syndrome are selected by the associated per-syndrome selection circuitry. Using this information, the cross-syndrome second best error event can be selected as follows. If the first and second best error event metrics generated by error event sorting circuitry 410 correspond to the same syndrome, then the cross-syndrome second best error event is set to the second best error event generated by error event sorting circuitry 410. Otherwise, if the first and third best error event metrics generated by error event sorting circuitry 410 correspond to the same syndrome, or the second and third best error event metrics generated by error event sorting circuitry 410 correspond to the same syndrome, then the cross-syndrome second best error event is set to the third best error event generated by error event sorting circuitry 410. Similar logic is applied in a step-by-step fashion as needed, proceeding through the final error event metric generated by error event sorting circuitry 410 for a given clock cycle. Thus, cross-syndrome second best selection circuitry 414 essentially chooses the best error event metric that shares a syndrome with another error event metric of equal or lower value (assuming lower values correspond to higher likelihoods). Because suitable sorting algorithms and circuitry will be apparent to those of skill in the art in view of the present disclosure, possible implementations of cross-syndrome second best selection circuitry 414 will not be described in detail herein.

Second global best selection circuitry 422 can receive cross-syndrome second best error event 420, along with second best per-syndrome error events 418a-418g. Second global best selection circuitry 422 can be operable to select the second best error event from its inputs and send that second global best error event to output selection circuitry 424. It will be noted that "second global best error event" is used herein as a notational short hand, and that error event does not necessarily correspond to the second best error event generated by error event sorting circuitry 410.

Output selection circuitry 424 can receive the output of second global best selection circuitry 422 and best per-syndrome error events 416a-416g. From among those received error events, output selection circuitry 424 can select the four best error events and output them as error events 432 to suitable post processing circuitry or other appropriate circuitry. Advantageously, output selection circuitry 424 can be configured to output any suitable number of error events, in accordance with the requirements of the LDPC code being used. For example, for a single-bit LDPC code, output selection circuitry 424 could be configured to output two error events in accordance with the parameters shown in FIG. 3. Any suitable selection/sorting circuitry can be used in output selection circuitry 424, including pipelined implementations. Because suitable sorting/selection algorithms and circuitry will be apparent to those of skill in the art in view of the present disclosure, possible implementations of output selection circuitry 424 will not be described in detail herein.

LLR computation circuitry 426 receives the decision bit syndromes generated by decision bit syndrome computation circuitry 406, along with best per-syndrome error events 416a-416g. LLR computation circuitry 426 then computes and generates parity LLRs 430, which are indicative of how likely certain error masks reflect errors actually introduced into decision bits 402 and 428. The operation of LLR computation circuitry 426 is described in more detail in connection with FIG. 8.

It will be noted that error event processing circuitry 400 is merely illustrative and other implementations are possible. For example, in some embodiments, functionality of error event sorting circuitry 410 can be incorporated into per-syndrome selection circuitries 412a-412g and cross-syndrome second best selection circuitry 414.

FIG. 5 is a diagram showing illustrative decision bit syndrome computation in accordance with some embodiments. Matrix 508 represents a parity scheme with three rows 502, 504, and 506 that have been determined (e.g., through simulation) to have relatively robust performance. Each of rows 502, 504, and 506 includes a binary string where a binary "1" represents a symbol bit position that is to be used to compute a corresponding syndrome bit. Here, the bits of the data symbol are denoted $x_0$-$x_{11}$. As shown in FIG. 5, each of the three syndrome bits $s_0$, $s_1$, and $s_2$ is computed as an exclusive-or ("XOR") of the symbol bits with positions corresponding to the binary "1"s in the appropriate row of matrix 508. For example, $s_0$ is computed as the XOR of bits $x_0$, $x_4$, and $x_8$ in accordance with the positions of the binary "1"s in row 502. $s_1$ and $s_2$ are computed in similar ways using their corresponding symbol bits.

It will be noted that each column of matrix 508 has exactly one binary "1." This is to ensure that each bit in a symbol is used in exactly one syndrome bit. Additionally, it will be noted that FIG. 5 depicts a scenario in which tribit LDPC coding is used with a 12-bit symbol length. Similar concepts can be adapted for use with other LDPC codes and other symbol lengths. Additionally, different matrices can be used in place of matrix 508.

Figure 6:
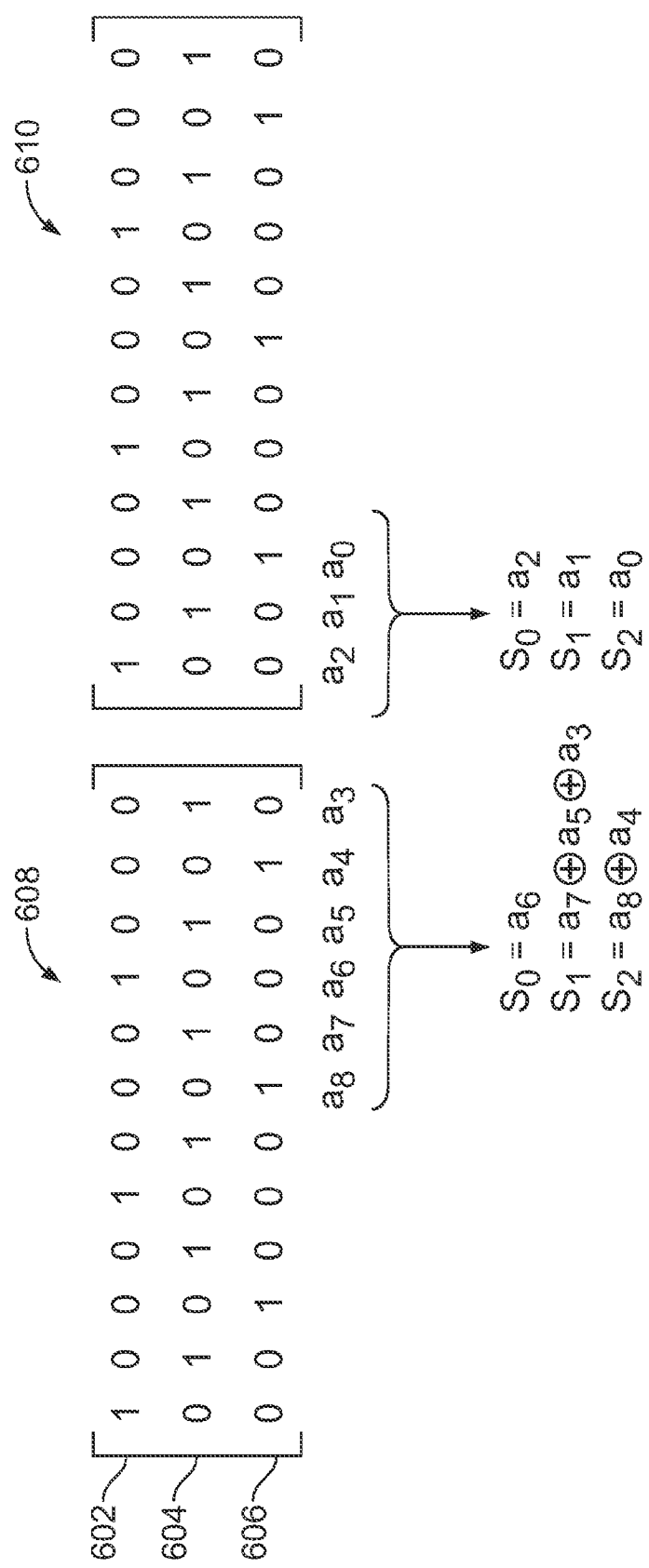
FIG. 6 is a diagram showing illustrative error event syndrome computation in accordance with some embodiments.

FIG. 6 is a diagram showing illustrative error event syndrome computation in accordance with some embodiments. Error event syndrome computation is very similar in many respects to the decision bit syndrome computation depicted in FIG. 6. However, one notable difference is that error event syndrome computation may require two matrices 608 and 610. This is because the computation may be based on bits chosen from two adjacent symbols. That is, the error mask, represented in FIG. 6 by bits $a_0$-$a_8$, may span both the current symbol and the previous symbol. The error mask in this scenario would advance by one bit along matrices 608 and 610 for each clock cycle or half clock cycle, depending on the design of the system. Because the error mask may span two adjacent symbols, two different syndromes (each with bits $s_0$-$s_2$) may need to be computed, one for each of the symbols represented by matrices 608 and 610.

As with FIG. 6, different symbol lengths and a different LDPC encoding scheme may be used. Additionally, different matrices may be used instead of matrices 608 and 610 depicted in FIG. 6. Similarly, FIG. 6 illustrates error event syndrome computation for a nine-bit error mask, but different error mask lengths may be used.

Figure 7:
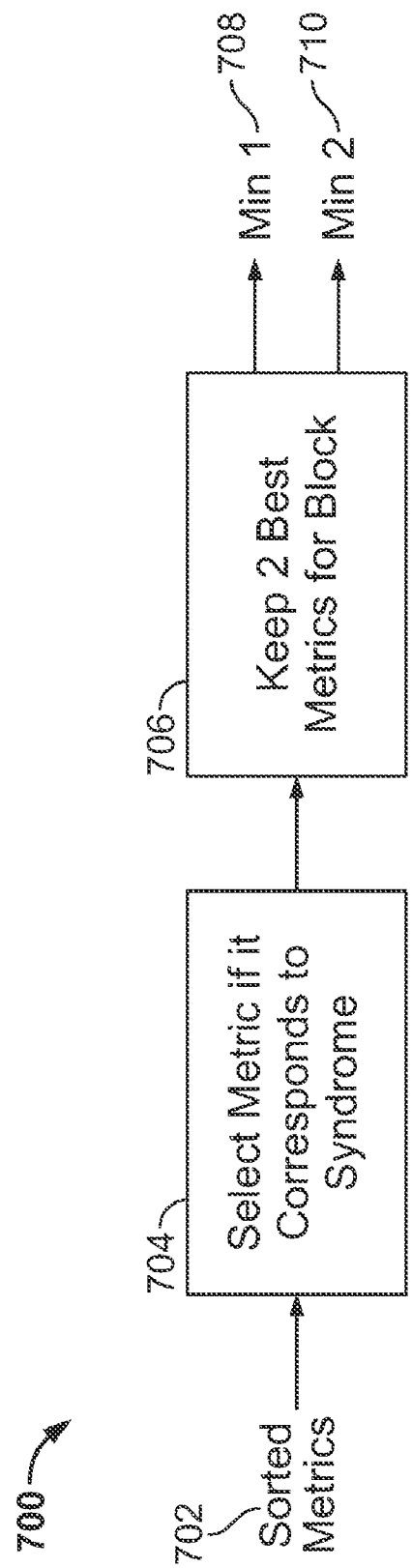
FIG. 7 is a block diagram showing illustrative per-syndrome selection circuitry in accordance with some embodiments.

FIG. 7 is a block diagram showing illustrative per-syndrome selection circuitry 700 in accordance with some embodiments. Per-syndrome selection circuitry 700 can be used in any or all of per-syndrome selection circuits 412a-412g in FIG. 4. Syndrome matching circuitry 704 receives sorted error event metrics 702 and selects the best (e.g. lowest) error event metric per clock cycle that corresponds to the particular syndrome with which per-syndrome selection circuitry 704 is associated. From that set, metric selection circuitry 706 retains the two best (e.g., lowest) error event metrics per symbol and outputs them as min1 708 and min2 710.

It will be noted that further details of per-syndrome selection circuitry 700 may be implemented in a variety of ways that are not depicted in FIG. 7 for the sake of clarity. For instance, per-syndrome selection circuitry may accept, along with sorted error event metrics 702, the corresponding error event masks maintained in the same order, and may output those masks along with min1 and min2. Alternatively, error event masks may be tracked by using indices corresponding to the error event masks, where the masks themselves are stored in a data structure and are accessible using the mask indices.

FIG. 8 is a diagram showing illustrative LLR computation in accordance with some embodiments. As shown in FIG. 8, the LLR computation can be illustrated with a notational convention in which s represents a possible decision bit syndrome value, M(N) represents the error event metric of the most likely error event corresponding to an error event syndrome with value N, and M(0) is defined to be zero.

Using this convention, the LLR of a possible syndrome value x, selected from among the values 1 through 7 as required by a tribit LDPC code in this illustrative example, is equal to the difference of M(s XOR x) and M(s). Here, the possible values of M are selected from among 0 to 31, which in turn means that the LLR values can range from −31 to 31. In the case where no error events are observed with a particular syndrome s, M(s) is by definition set to the maximum value (31 in this example) in order to indicate, for the purposes of subsequent LDPC decoding, that that particular syndrome is a less likely source of appropriate error events than other syndromes.

It will be noted that the illustrative example depicted in FIG. 8 assumes use of a tribit LDPC code with seven possible syndrome values and 32 possible error event metric values. All ranges and values used in such computations are illustrative only, and other ranges and values may be used (e.g., in connection with dibit or single-bit LDPC codes). For example, if a dibit LDPC code were used x could range from 1 to 3 in accordance with the requirements summarized in FIG. 3.

Figure 9:
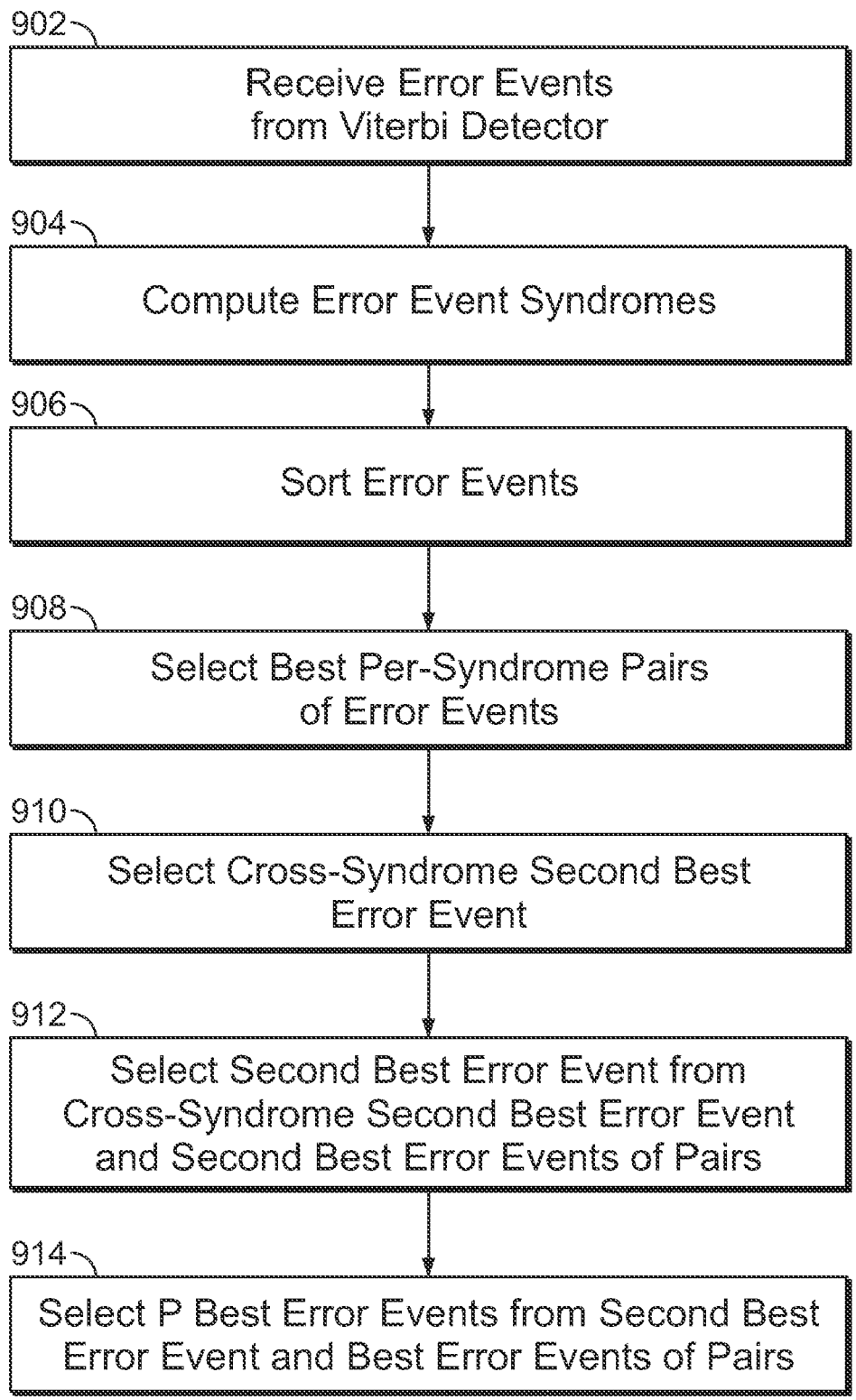
FIG. 9 is a flow diagram showing a method for selecting output error events in accordance with some embodiments.

FIG. 9 is a flow diagram showing a method for selecting output error events in accordance with some embodiments. At 902, error events are received from a Viterbi decoder/detector, such as modified trace-back Viterbi detector 124 of FIG. 1A, modified trace-back Viterbi decoder 116 of FIG. 1B, or any other suitable decoder/detector circuitry. The received error events can include error event masks and error event metrics. At 904, error event syndromes are computed, where the number of possible error event syndrome values is mapped to the LDPC code being used (e.g., in accordance with FIG. 3). The error event syndrome computation may be performed in any suitable way, such as using circuitry and techniques described in connection with error event syndrome computation circuitry 408 (FIG. 4) and the techniques described in connection with FIG. 6. At 906, the received error events are sorted according to their metrics (e.g., lowest metric first) in any suitable way, such as using circuitry and techniques discussed in connection with error event sorting circuitry 410 of FIG. 4.

At 908, the best pair of error events, as determined by their error event metrics, is selected from among the sorted error events for each possible syndrome value. The selection may be performed in any suitable way, such by as using techniques and circuitry described in connection with per-syndrome selection circuitries 412a-412g (FIG. 4) and per-syndrome selection circuitry 700 in FIG. 7. At 912, a cross-syndrome second best error event is selected according to its metric from among the sorted error events. This selection may likewise be performed in any suitable way, such as by using circuitry and techniques described in connection with cross-syndrome second best selection circuitry 414 of FIG. 4. At 912, a global second best error event is selected from among the cross-syndrome second best error event determined at 910 and the second best error event of each syndrome determined as part of 908. This selection may be done in any suitable way, such as by using circuitry and techniques described in connection with second best selection circuitry 422 of FIG. 4.

Finally, at 914, the P best error events are selected from among the global second best error event selected at 912 and the best error event for each syndrome selected as part of 908. This selection may be performed in any suitable way, such as using the circuitry and techniques discussed in connection with output selection circuitry 424 of FIG. 4. Here, the number of error events P to output may be determined by the requirements of the particular LDPC code being used, such as by following the parameters established by illustrative table 300 of FIG. 3.

It will be noted that the flow diagram of FIG. 9 is merely illustrative, and at least some of the elements depicted may be re-ordered, omitted, or otherwise modified without deviating from the spirit of the invention. For example, 906 and 908 may be combined. Additionally, other elements may be included in the method.

Figure 10:
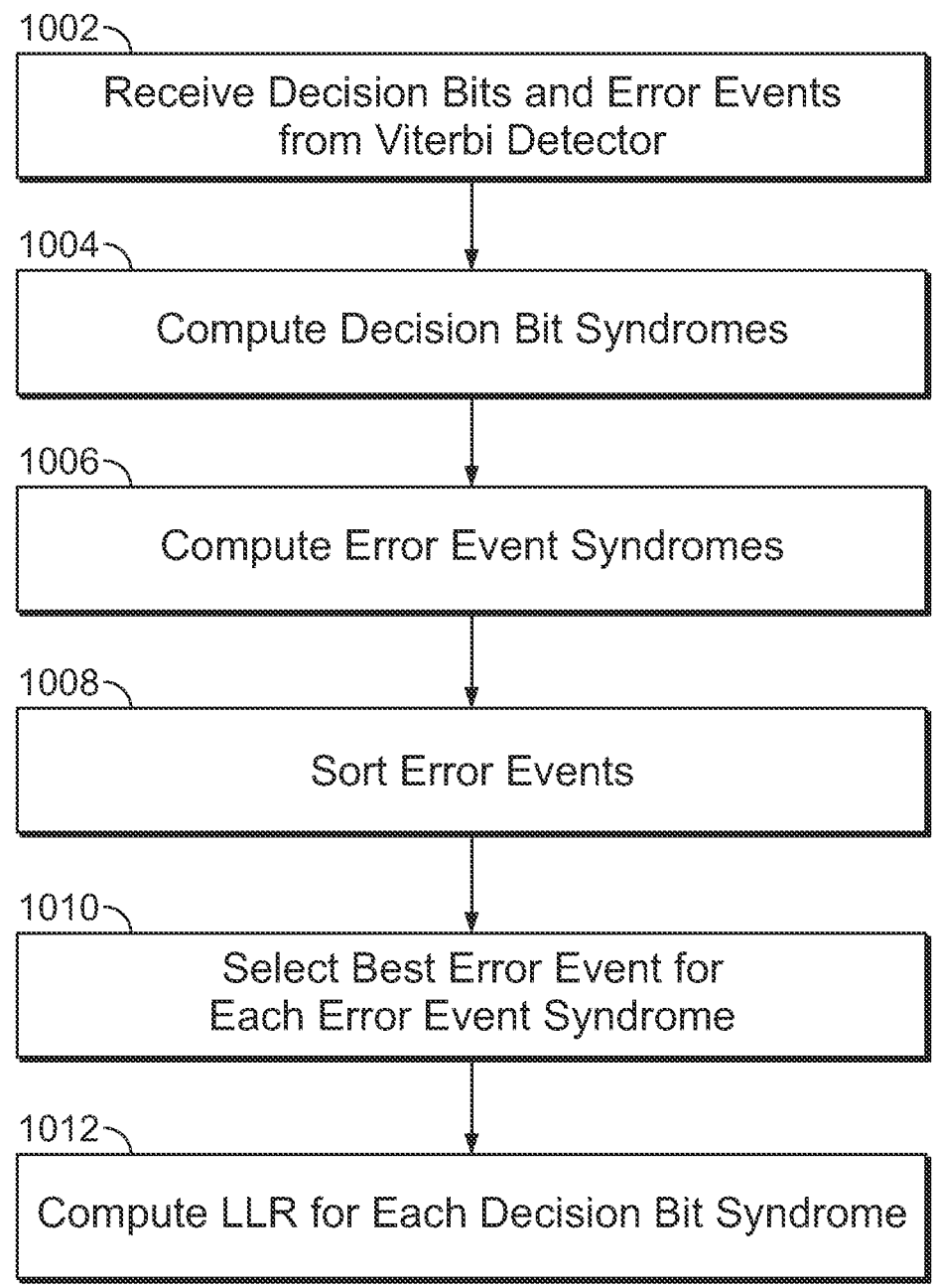
FIG. 10 is a flow diagram showing a method for computing log-likelihood ratios in accordance with some embodiments.

FIG. 10 is a flow diagram showing a method for computing LLRs in accordance with some embodiments. At 1002, decision bits and error events are received from a Viterbi decoder/detector, such as modified trace-back Viterbi detector 124 of FIG. 1A, modified trace-back Viterbi decoder 116 of FIG. 1B, or any other suitable decoder/detector circuitry. The received error events can include error event masks and error event metrics. At 1004, decision bit syndromes are computed for the received decision bits. The computation may be performed in any suitable way, such as using techniques and circuitry discussed in connection with decision bit syndrome computation circuitry 406 (FIG. 4) and the techniques discussed in connection with FIG. 5. Similarly, at 1006, error event syndromes may be computed based on the error events received at 1002 in a way that may be substantially similar to that described in connection with 904 of FIG. 9.

At 1008, the error events received at 1002 are sorted in a way that may be substantially similar to that described in connection with 906 of FIG. 9. At 1010, the best error event from among the sorted error events produced by 1008 is selected for each possible error event syndrome value. Circuitry and techniques for performing this selection may be similar to those used in 908 of FIG. 9, except that in 1010, for purposes of LLR computation only, it is not necessary to simultaneously select the second best error event for each syndrome. Finally, at 1012 a LLR value is computed for each decision bit syndrome computed in 1004. The computation may be performed in any suitable way, such as by using circuitry and techniques described in connection with LLR computation circuitry 426 (FIG. 4) and the techniques described in connection with FIG. 8.

It will be noted that the flow diagram of FIG. 10 is merely illustrative, and at least some of the elements depicted may be re-ordered, omitted, or otherwise modified without deviating from the spirit of the invention. Additionally, other elements may be included in the method.

Accordingly, what have been described thus far are systems and methods for processing error events, including error event masks and error event likelihood metrics, in connection with LDPC decoding. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A method of decoding a codeword comprising:
    receiving decision bits produced by decoding the codeword and a plurality of candidate error events;
    for each of a plurality of syndrome values, selecting a set of error events capable of producing the syndrome value from the plurality of candidate error events, wherein selecting the set of error events comprises selecting a predetermined number of error events capable of producing the syndrome value from the plurality of candidate error events by ranking a plurality of error event metrics according to lowest values; and
    decoding the codeword by correcting the received decision bits using the selected set of error events for each of the plurality of syndrome values.

2. The method of claim 1, wherein decoding the codeword further comprises:
    computing a plurality of parity log-likelihood ratio (LLR) values based on the received decision bits and the selected set of error events for each of the plurality of syndrome values; and
    performing low-density parity check (LDPC) decoding on the codeword based on the plurality of parity LLR values.

3. The method of claim 1, wherein decoding the codeword further comprises determining whether two largest error event metrics in a plurality of error event metrics correspond to a common syndrome value.

4. The method of claim 1, wherein the decision bits are generated by a Viterbi decoder.

5. The method of claim 1, wherein a number of error events in all of the selected sets of error events is fewer than a number of error events in the plurality of candidate error events.

6. A circuit comprising:
    receiver circuitry configured to receive decision bits produced by decoding the codeword and a plurality of candidate error events;
    error event sorting circuitry configured to select, for each of a plurality of syndrome values, a set of error events capable of producing the syndrome value from the plurality of candidate error events, wherein the error event sorting circuitry is further configured to select the set of error events by selecting a predetermined number of error events capable of producing the syndrome value from the plurality of candidate error events by ranking a plurality of error event metrics according to lowest values; and
    decoding circuitry configured to decode the codeword by correcting the received decision bits using the selected set of error events for each of the plurality of syndrome values.

7. The circuit of claim 6, wherein the decoding circuitry is further configured to:
    compute a plurality of parity log-likelihood ratio (LLR) values based on the received decision bits and the selected set of error events for each of the plurality of syndrome values; and
    perform low-density parity check (LDPC) decoding on the codeword based on the plurality of parity LLR values.

8. The circuit of claim 6, wherein the decoding circuitry is further configured to determine whether two largest error event metrics in a plurality of error event metrics correspond to a common syndrome value.

9. The circuit of claim 6, wherein the receiver circuitry is further configured to receive the decision bits from an output of a Viterbi decoder.

10. A method of decoding a codeword comprising:
    receiving a plurality of candidate error events and a plurality of error event metrics for use in decoding the codeword;
    for each of a plurality of syndrome values, selecting a set of error events capable of producing the syndrome value from the plurality of candidate error events, wherein selecting the set of error events comprises selecting a predetermined number of error events capable of producing the syndrome value from the plurality of candidate error events by ranking a plurality of error event metrics according to lowest values; and
    decoding the codeword by correcting decision bits of the codeword using the selected set of error events for each of the plurality of syndrome values.

11. The method of claim 10, wherein the predetermined number of error events is a constant number for each of the plurality of syndrome values.

12. The method of claim 10, wherein decoding the codeword further comprises:
    computing a plurality of parity log-likelihood ratio (LLR) values based on the selected set of error events for each of the plurality of syndrome values; and
    performing low-density parity check (LDPC) decoding on the codeword based on the plurality of parity LLR values.

13. The method of claim 10, wherein decoding the codeword further comprises determining whether two largest error event metrics in the plurality of error event metrics correspond to a common syndrome value.

14. The method of claim 10, wherein the plurality of candidate error events are most likely error events in decoded information produced by a Viterbi decoder.

15. The method of claim 10, wherein a number of error events in all of the selected sets of error events is fewer than a number of error events in the plurality of candidate error events.

* * * * *